(12) United States Patent
Gregorius et al.

(10) Patent No.: US 7,184,360 B2
(45) Date of Patent: Feb. 27, 2007

(54) HIGH-SPEED INTERFACE CIRCUIT FOR SEMICONDUCTOR MEMORY CHIPS AND MEMORY SYSTEM INCLUDING SEMICONDUCTOR MEMORY CHIPS

(75) Inventors: Peter Gregorius, Munich (DE); Martin Streibl, Petershausen (DE); Paul Wallner, Prien (DE); Thomas Rickes, Munich (DE)

(73) Assignee: Infineon Technologies, AG, Munich (DE)

( * ) Notice: Subject to any disclaimer, the term of this patent is extended or adjusted under 35 U.S.C. 154(b) by 92 days.

(21) Appl. No.: 11/152,769

(22) Filed: Jun. 15, 2005

(65) Prior Publication Data

US 2006/0285424 A1 Dec. 21, 2006

(51) Int. Cl.
*G11C 8/00* (2006.01)
(52) U.S. Cl. .................................. 365/233; 365/219
(58) Field of Classification Search ................ 365/233, 365/219, 220, 221
See application file for complete search history.

(56) References Cited

U.S. PATENT DOCUMENTS 6,108,745 A * 8/2000 Gupta et al. .................... 711/3
7,123,497 B2 * 10/2006 Matsui et al. ................. 365/63

* cited by examiner

*Primary Examiner*—Vu A. Le
(74) *Attorney, Agent, or Firm*—Edell, Shapiro & Finnan, LLC

(57) ABSTRACT

A high-speed interface circuit is implemented in a semiconductor memory chip including a memory core, a first interface circuit section, and a second interface circuit section. The first interface circuit section is connectable to a write data-/command and address signal bus, includes a write data-/command and address re-driver/transmitter path (which may be transparent) and does not include any clock signal synchronizing circuitry, and a main write signal path including a serial-to-parallel converting and synchronizing device to synchronize with a reference clock signal received write data-/command and address signals and delivering the parallel converted write signals to the memory core. The second interface circuit section is connectable to a read data bus and includes a transparent read data re-driver/transmitter path for transmitting and re-driving received serial read data to a succeeding semiconductor memory chip and a main read signal path for inserting the parallel-to-serial converted read data from the memory core into the received serial read data stream, synchronizing the parallel-to-serial converted read data with the reference clock signal and providing the serialized read data stream to a serial read data input terminal of a corresponding second interface circuit section of a succeeding same memory chip or to a memory controller.

32 Claims, 10 Drawing Sheets

(WR)

(WR)

(RD)

HIGH-SPEED INTERFACE CIRCUIT FOR SEMICONDUCTOR MEMORY CHIPS AND MEMORY SYSTEM INCLUDING SEMICONDUCTOR MEMORY CHIPS

FIELD OF THE INVENTION

The present invention relates to a high-speed interface circuit, a semiconductor memory chip including the same and to a memory system including such semiconductor memory chips.

BACKGROUND

Recent developments in fast semiconductor memories are leading to high-speed signal transmission rates of, for example, up to 7 Gbit/second. These high signal transmission rates require careful design considerations with respect to the implementation of an appropriate topology and a suitable design of interface circuits such that these high signal transmission rates can be realized.

Future generations of memory systems will arrange the memory chips in a chip cascade or chip chain which aims to increase the attainable storage density. For this chaining of the memory chips, serial high speed interface circuits are required to include a repeater (re-driver) function.

The enclosed FIGS. 1A to 1D respectively show block diagrams of different architectures of the arrangement of semiconductor memory chips. FIG. 1A depicts a loop forward architecture of, for example, four semiconductor memory chips M1, M2, M3 and M4 on a memory module MMOD, wherein rank 1 is given to memory chip M1, rank 2 to memory chip M2, rank 3 to memory chip M3 and rank 4 to memory chip M4. Write-/command and address signals WR/eCA are transmitted through a write data-/command and address signal bus from a memory controller C to the first memory chip M1 and from there to one or more of the following memory chips M2, M3 and M4, and the read data RD are transmitted separately through a read data bus from one or more of the memory chips M1 to M4 to the memory controller C.

FIG. 1B depicts another possibility of arranging the chain of memory chips M1 to M4 on the memory module MMOD in a shared loop for the write data-/command and address signals WR/eCA and the read data signals RD.

Both architectures depicted in FIGS. 1A and 1B have following common characteristics: the propagation time for WR/eCA and RD is matched by the structure; the sum of the propagation times is constant for each rank; read data RD of each rank inserts natively; and the system calibration is quite simple.

FIG. 1C schematically shows a further architecture in which four semiconductor memory chips M1 to M4 attached on a memory module MMOD are arranged in a loop back architecture, wherein the write data-/command and address signals WR/eCA are transmitted via a write data-/command and address signal bus to one or more of the four memory chips M1 to M4 in one direction (from the memory controller C to the right) and the read data RD are transmitted from one or more of the four memory chips M1 to M4 to the memory controller C in the inverse direction (i.e., from right to left in FIG. 1C).

Another possible topology, namely the star topology is depicted in FIG. 1D. A first memory chip M1* on the memory module MMOD is a dedicated master memory chip and has a re-drive function for the write data-/command and address signals WR/eCA on a write data-/command and address bus to the other memory chips M2 to M4 on the memory module which are connected to the master memory chip M1* in a star topology. The master memory chip M1* must have a re-drive function for read data RD sent from one or more of the memory chips M2 to M4 for transmitting the same to the memory controller C.

The fundamental characteristics of both topologies, namely the loop back architecture shown in FIG. 1C and the star topology shown in FIG. 1D are: the total propagation time for the write data-/command and address signals and for read data is different for each rank; read data insertion is sophisticated; the total delay is depending on PVT; and the system calibration is difficult.

FIG. 2 shows more details of a memory module MMOD on which are attached four memory chips M1, M2, M3 and M4 to which rank 1, rank 2, rank 3 and rank 4 are respectively associated. The memory chips M1 to M4 are arranged in a loop forward architecture and connectable to a memory controller C (not shown). FIG. 2 schematically shows that each memory chip M1 to M4 includes a first interface circuit section I1 for receiving and transmitting write data-/command and address signals from the memory controller C through a write data-/command and address signal bus to one or more of the memory chips M1 to M4, and each first interface circuit section I1 includes a transparent write data-/command and address signal re-driver/ transmitter path. Each memory chip M1 to M4 further includes a second interface circuit section I2 connected to a read data bus RD for transmitting read data signals from one or more of the memory chips M1 to M4 to the memory controller C. Also the second interface circuit section I2 includes a transparent read data re-driver/transmitter path. FIG. 2 further shows a clock signal bus CLK for receiving, for example, from the memory controller a clock signal CLK (reference clock) and transmitting the same to a memory core MCORE of each memory chip M1 to M4 and from each of the memory chips M1, M2, M3 to the respectively next adjacent memory chip.

As mentioned above for the loop forward architecture shown in FIG. 1A, the propagation time of the write data-/ command and address signals WR/eCA and of the read data signals is matched by the structure, the sum of the propagation times is constant for each rank, the read data of each rank inserts natively and the calibration of the system is quite simple. The block diagram of FIG. 2 further shows that the transparent signal path for write data-/command and address signals WR/eCA and read data RD, respectively, are fully transparent for the memory controller C. Further, the memory controller cannot localize any arbitrary placement of a memory chip on the line and each rank shows a fully equal timing.

For a memory system design of a memory module as it is shown in FIG. 2 there are the following objectives: same propagation direction; same propagation delay for each rank; same latency for each rank; no functional cause of collision of read data; and the timing calibration at the memory controller C should be simple.

SUMMARY

It is an object of the present invention to provide a high-speed interface circuit which has a repeater/re-drive function and can be implemented in semiconductor memory chips having different architectures of their arrangement and cascade connection on a memory module including, for example, a loop forward architecture as is depicted in FIGS. 1A and 2 and a loop back architecture as is depicted in FIG. 1C.

This and other objects are achieved in accordance with the present invention by providing a high-speed interface circuit implemented in a semi-conductor memory chip including a memory core, the high-speed interface circuit comprising:

a first interface circuit section connectable to a write data-/command and address bus and including:
   a serial input terminal to receive a serial stream of write data-/command and address signals from a serial output terminal of a corresponding first interface circuit section of a preceding same memory chip or from a serial output terminal of a memory controller, the serial input terminal connected to:
      a write data-/command and address re-driver/-transmitter path configured for re-driving the serial stream of write data-/command and address signals to a serial output terminal thereof to be connected to a serial input terminal of a corresponding first interface circuit of a next same memory chip; and
      a main write signal path arranged between the serial input terminal and a parallel output terminal and including serial-to-parallel conversion and synchronization means for serial-to-parallel converting and synchronizing with a reference clock signal the write data-/command and address signals received at the serial input terminal and delivering the serial-to-parallel converted and synchronized write data-/command and address signals to the parallel output terminal of the first interface circuit section and from the parallel output terminal to the memory core; and
a second interface circuit section connectable to a read data bus and including:
   a parallel read data input terminal connected to the memory core to receive parallel read data from the memory core;
   a serial read data input terminal connected to receive a serial read data stream from a serial read data output terminal of a corresponding second interface circuit section of a preceding same memory chip and configured for re-driving the received serial read data stream through a read data re-driver/-receiver path to a serial read data output terminal of the second interface circuit section; and
   a main read signal path connected between the parallel read data input terminal and the serial read data output terminal and having means for inserting the parallel-to-serial converted read data read from the memory core and received at the parallel read data input terminal into the serial read data stream from the serial read data input terminal, synchronizing the serial read data stream with a reference clock signal and providing the serialized read data stream to the serial read data output terminal connected via the read data bus to a serial read data input terminal of a corresponding second interface circuit section of a next same memory chip or to a serial read data input terminal of the memory controller;
wherein the first and second interface circuit sections further include a reference clock receiving terminal to receive the reference clock signal.

The above high-speed interface circuit can be implemented in a memory system arranged in a loop forward architecture or a loop back architecture, such as the architectures described above and depicted in FIGS. 1A, 1C and 2. When being implemented in semiconductor memory chips of a memory system arranged in a loop forward architecture, the advantage of the present invention resides in the fact that the sum of latency of read signals and write data-/command and address signals for each memory chip is independent of the respective rank thereof. Further, the control procedure by the memory controller is simplified.

However, when the high-speed interface circuit according to the invention is implemented in semiconductor memory chips in a memory system being arranged in a loop back architecture, the latencies of the read and write signal paths are different for each memory chip.

The high-speed interface circuit according to the invention can be principally operated by a full speed clock, a half rate clock, a third rate clock or a quarter rate clock. The latter expressions "full speed", "half rate", "third rate" and "quarter rate" refer to a clock rate of a reference clock and its relation to a basic system clock.

Preferably, the high speed memory interface circuit includes in the write data-/command and address signal re-driver/transmitter path of the first interface circuit section a transparent write signal re-driving/transmitting device not including a clock signal synchronizing circuit. Further, the high-speed memory interface circuit preferably includes in the read data re-driver/transmitter path of the second interface circuit section a transparent read signal re-driving transmitting device not including a clock signal synchronizing circuitry.

Further, preferably the high-speed interface circuit includes in the write data-/command and address signal re-driver/transmitter path of the first interface circuit section synchronized write signal re-driving transmitting and synchronization means for synchronizing the re-driven write data-/command and address signals with the reference clock signal. Further, the high-speed interface circuit also includes in the read data re-driver/transmitter path of the second interface circuit section synchronized read signal re-driver/transmitting and synchronizing means for synchronizing the re-driven read signals with the reference clock signal.

In one embodiment, the first interface circuit section includes both the write data-/command and address signal re-driver/transmitter path and further includes a first switching device arranged in the serial write data-/command and address stream before the serial output terminal of the first interface circuit section, wherein the first switching device selectively switches between the transparent and the synchronized write signal re-driver/transmitter means and is controlled by an external control signal from the memory controller or by a control signal included in the protocol of the write data-/command and address signal stream.

Further, the second interface circuit section includes in the read data re-driver/transmitter path both the transparent read signal re-driving/transmitting means and the synchronized read signal re-driver/transmitting and the synchronization means, wherein first switching device is arranged before the serial output terminal of the second interface circuit section, and the first switching device that selectively switches between the transparent and the synchronized read signal re-driver/transmitter means is controlled by a control signal included in the protocol of the write data-/command and address signal stream or by an external signal from the memory controller.

In another embodiment, the high-speed interface circuit includes in the first interface circuit section:
   a bit synchronization unit arranged after the serial input terminal to sample and bit-synchronize the serial stream of write data-/command and address signals according to the reference clock signal;

an even-odd bit alignment unit serially connected after the bit synchronization unit and configured for buffering the serial write data-/command and address signals synchronized and sampled by the bit synchronization unit and aligning the sampled even and odd signals synchronously with the reference clock signal;

a serial-to-parallel converter unit serially connected after the even-odd bit alignment unit and configured for converting the serial write data-/command and address signals buffered and aligned by the even/odd bit alignment unit into a parallel data stream having an arbitrary data width; and a data delivery FIFO-unit connected after the serial-to-parallel converter unit at the parallel output terminal and configured for delivering the parallel data stream to the memory core synchronized with an internal clock rate of the memory core and compensating for different data skews and drifts.

Preferably, in the first interface circuit section of the high-speed interface circuit, the bit synchronization unit, the even-odd alignment unit, the serial-to-parallel converter unit and the data delivery FIFO-unit are respectively arranged to supply the reference clock signal synchronized by the bit synchronization unit with the serial write data-/command and address signal stream to the respectively next of the units together with each of the supplied write data-/command and address signals.

The first interface circuit section also preferably includes a drift compensation FIFO-unit serially connected after the even-odd bit alignment unit and configured for compensating phase drift of the even-odd bit aligned serial write data-/command and address signals in synchronism with the reference clock signal, and a 2:1-serializer serially arranged after the drift compensation FIFO-unit. The bit synchronization unit and the even-odd bit alignment unit are respectively arranged to supply the reference clock signal synchronized by the bit synchronization unit with the serial write data-/command and address signal stream to the respectively next of the units together with each of the supplied write data-/command and address signals.

Further, a data input of the serial-to-parallel converter unit can be connected to an output of the drift compensation FIFO-unit.

Alternatively, a data input of the serial-to-parallel converter unit can be connected to an output of the even-odd bit alignment unit.

In another embodiment, the first interface circuit section further includes:

a drift compensation FIFO-unit serially connected after the even-odd bit alignment unit and configured for compensating phase drift of the even-off bit aligned serial write data-/command and address signals in synchronism with the reference clock signal;

a de-emphasis FIR-unit serially connected after the drift compensation FIFO and configured for channel adaptation to compensate for intersymbol interference; and a 2:1 serializer serially connected after the de-emphasis FIR-unit.

Preferably, the bit synchronization unit and the even-odd bit alignment unit in this embodiment are respectively arranged to supply the reference clock signal synchronized by the bit synchronization unit with the serial write data-/command and address signal stream to the respectively next of the units together with each of the supplied write data-/command and address signals.

Also in this embodiment, the data input of the serial-to-parallel converter unit is connected to an output of a drift compensation FIFO-unit. Alternatively the de-emphasis FIR-unit and the drift compensation FIFO-unit are combined and a data input of a serial-to-parallel converter unit is connected to an output of the de-emphasizes FIFO-unit.

Advantageously the drift compensation FIFO-unit may have a depth according to plural symbol sequences of the serial write data-/command and address signals. In addition, the de-emphasis FIR-unit can be switched on/off by an external signal from the memory controller.

In a further embodiment, the second interface circuit section includes in the main read signal path:

a read FIFO-unit arranged at the parallel read data input terminal for adapting a data rate of data read from the memory core to a clock domain of the second interface circuit section;

a parallel-to-serial converter unit connected after the read FIFO-unit and arranged to carry out parallel-to-serial conversion of the read data and to convert their clock rate to the clock rate of the reference clock;

a de-emphasis FIR-unit serially connected after the parallel-to-serial converter circuit and arranged to compensate for intersymbol interference; and a 2:1 serializer serially arranged after the de-emphasis FIR-unit.

The de-emphasis FIR-unit can be switched on/off by an external signal from the memory controller. Further, the de-emphasis FIR-unit is arranged to receive a reference clock signal and supply the reference clock signal to the parallel-to-serial converter unit, and the parallel-to-serial converter unit is arranged to supply the reference clock signal to the read FIFO-unit.

The read data re-driver/transmitter path of the second interface circuit section includes a transparent read signal re-driving/transmitting means not including any clock signal synchronizing circuitry, and synchronized read data re-driver/transmitting and synchronization means for synchronizing the re-driven read signals with the reference clock signal, and first switching device is arranged immediately before the serial output terminal of the second interface circuit section, the first switching device being controlled by a control bit included in the protocol of the write data-/command and address signals or by an external signal from the memory controller for selectively switching between the transparent and the synchronized read signal re-driver/transmitter means. In addition, the synchronized read data re-driver/transmitter and synchronization means further includes:

a bit synchronization unit serially connected after the serial read data input terminal as the read data synchronization means configured for sampling and bit-synchronizing the serial stream of read data with the reference clock signal;

an even-odd bit alignment unit serially connected after the bit synchronization unit and configured for buffering the serial read data signals synchronized and sampled by the bit synchronization unit and aligning the same synchronously to the reference clock signal;

a drift compensation FIFO-unit serially connected after the even-odd bit alignment unit and configured for compensating phase drift of the even-odd bit aligned read data signals in synchronism with the reference clock signal;

a second switching device inserted between the drift compensation FIFO-unit, the parallel-to-serial converter unit and the de-emphasis FIR-unit of the main read signal path and configured for switching over between the synchronized re-driven read data signals and the parallel-to-serial converted read data signals in synchronism with the reference clock signal and thereby inserting the parallel-to-serial converted read data signals into the read data signal stream;

the de-emphasis FIR-unit, the 2:1 serializer of the main read signal path; and the first switching device.

The bit synchronization unit and the even-odd bit alignment unit are respectively arranged to supply the reference clock signal synchronized by the bit synchronization unit with the serial read data stream from the serial read data input terminal to the respectively next of the units together with each of the supplied read data signals.

In this embodiment, the drift compensation FIFO unit and the parallel-to-serial converter unit are arranged to belong to the same clock domain.

As mentioned above, the clock rate of the reference clock signal in the inventive high-speed interface circuit can be one half of or one third of or one quarter of or equal to the clock rate of a memory system clock.

In another embodiment of the present invention, a semiconductor memory chip is provided including a memory core and the high-speed interface circuit of the invention comprising the features as described above. The memory core of the semiconductor memory chip can be a dynamic RAM-memory core.

According to still another embodiment of the present invention, a semiconductor memory system includes a plurality of semiconductor memory chips as described above arranged on a memory module in the form of a cascade and having different memory ranks and connected by a write data-/command and address bus and a read data bus and in a point-to-point fashion to the memory controller.

In this memory system, the semiconductor memory chips, the write data-/command and address bus and the read data bus can be arranged on the memory module and connected to the memory controller in a loop forward architecture. Alternatively, the semiconductor memory chips, the write data-/command and address bus and the read data bus can be arranged on the memory module and connected to the memory controller in a loop back architecture. Further still, the semiconductor memory chips, the write data-/command and address bus and the read data bus can be arranged on the memory module and connected to the memory controller in a ring architecture.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

A first embodiment of the present invention is described below with reference to FIGS. 3 and 4, where these figures schematically depict functional block diagrams of a first interface circuit section I1 for receiving and transmitting a write data-/command and address signal stream WR_S and connectable to a write data-/command and address bus (not shown), and a second interface circuit section I2 for receiving and transmitting a read data signal stream and connectable to a read data bus of a memory system (not shown). Both the first and second interface circuit section I1 and I2 are designed to be implemented, for example, in semiconductor memory chips M1 to M4 of a memory system as described above and depicted in FIG. 2.

Figure 3:
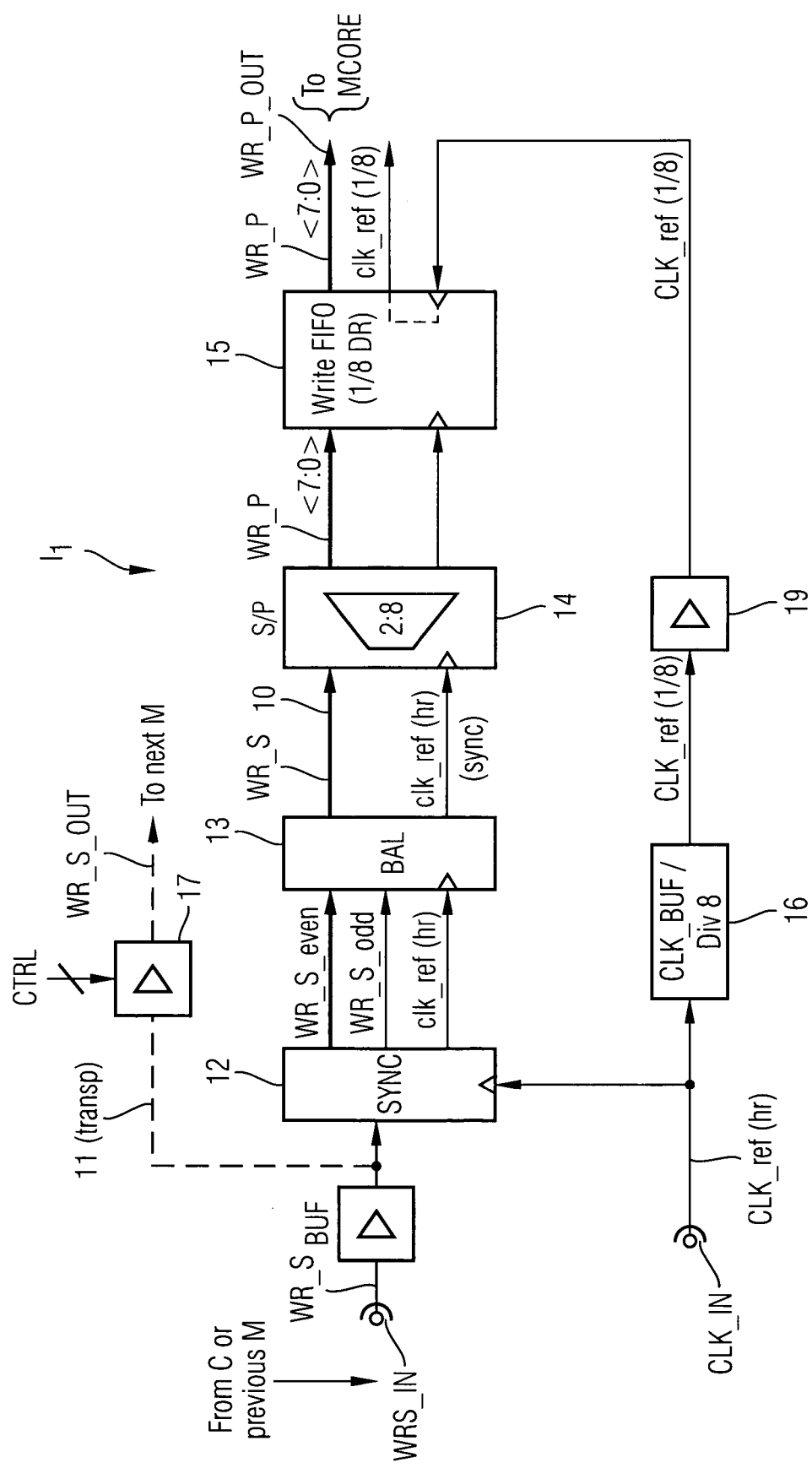
FIG. 3 schematically depicts a functional block diagram of an embodiment of a first interface circuit section to receive and transmit a write data-/command and address signal stream and arranged to include a transparent write signal re-driving/transmitting path in accordance with a first embodiment of a high-speed interface circuit section of the present invention.

As depicted in FIG. 3, the first interface circuit section I1 includes a serial input terminal WRS_IN for receiving a serial stream of write data-/command and address signals WR_S through a write data-/command and address bus (not shown) from a serial output terminal (not shown) of a corresponding first interface circuit section of a preceding same memory chip or from a serial output terminal of a memory controller (not shown). After passing a buffer circuit BUF, the serial stream of write data-/command and address signals WR_S from the serial input terminal WRS_IN branches into a main write signal path 10 and a write data-/command and address re-driver/transmitter path 11 which, as shown in FIG. 3, includes a transparent write signal re-driving/transmitting device symbolically depicted as a buffer circuit 17 which can be enabled/disabled by a control signal CTRL from outside of the first interface circuit section I1 (for example from the memory controller). The transparent write signal re-driving/transmitting device 17 of the transparent write data-/command and address re-driver/transmitter path 11 is connected at its output to a serial output terminal WRS_OUT that is connectable to a serial input terminal of a corresponding first interface circuit of a next same memory chip M (not shown).

The serial stream of write data-/command and address signals WR_S are fed from the buffer circuit BUF through the main write signal path 10 at first to a bit synchronization unit (SYNC) 12 having the function of sampling and bit synchronizing the serial stream of a write data-/comrnand and address signals WR_S in accordance with a reference clock CLK_ref(hr) received at a clock receiving terminal CLK_IN. An even bit write data-/command and address signal stream WR_S_even and an odd bit write data-/command and address signal stream WR_S_odd are respectively fed from SYNC 12 to inputs of an even-odd bit alignment unit (BAL) serially connected after SYNC 12. Like the even-odd bit write data-/command and address signal stream from SYNC 12, the reference clock signal CLK_ref(hr) is fed from SYNC 12 to BAL 13 for aligning the sampled even-odd write data-/command and address signal stream synchronously with the reference clock signal CLK_ref(hr).

Serially coupled after BAL 13 in the main write signal path 10 is a serial-to-parallel converter unit (S/P) 14 configured for converting the serial write data-/command and address signals buffered and aligned by BAL 13 into a parallel data stream WR_P of write data-/command and address signals. S/P 14 also receives from BAL 13 the reference clock signal CLK_ref(hr) (sync) synchronized with the even-odd bit aligned write data-/command and address signal stream WR_S and outputs the parallel data stream WR_P of write data-/command and address signals having an arbitrary data width. In main write signal path 10 following the serial-to-parallel converter 14 a data delivering FIFO-unit 15 (write FIFO) is connected with its output to a parallel output terminal WR_P_OUT of the first interface circuit section I1 and from there to the memory core MCORE (not shown). The data delivery FIFO-unit 15 is configured for delivering the parallel data stream WR_P to the memory core in synchronism with an internal clock rate of the memory core MCORE and for compensating for different data skews and drifts.

In the embodiment of the first interface circuit section I1 shown in FIG. 3, the clock rate of the reference clock signal CLK-ref(hr) is one half of the clock rate of a memory system clock (not shown) and the clock signal path includes a clock buffer/divider (CLK_BUF/DIV 8) 16 dividing the half rate reference clock signal CLK_ref(hr) by the number 8. The reference clock signal path further includes a clock signal buffer circuit 19. In dividing the half rate reference clock signal CLK_ref(hr) by ⅛, the divided reference clock signal CLK-ref (⅛) has the clock rate of the memory core MCORE so that the parallel write data-/command and address signal stream WR_P at the parallel write signal output terminal WR_P_OUT is synchronized by the data delivery FIFO-unit 15 with the internal clock rate of the memory core, wherein in the present example the internal clock rate of the memory core MCORE is ⅛ of the clock rate of the half rate reference clock signal CLK_ref(hr).

Notably, the first interface circuit section I1 depicted in FIG. 3 does not show any decoding circuitry for decoding which serial write data-/command and address signals WR_S received at the serial input terminal WRS_IN from the memory controller C or from the previous memory chip M are designated for the memory core of the present memory chip and therefore delivered through the main write signal path 10 or otherwise are re-driven through the transparent write data-/command and address re-driver/transmitter path 11 to the next memory chip M. Such decoding circuitry is not in the high-speed interface circuit of the present invention.

Figure 4:
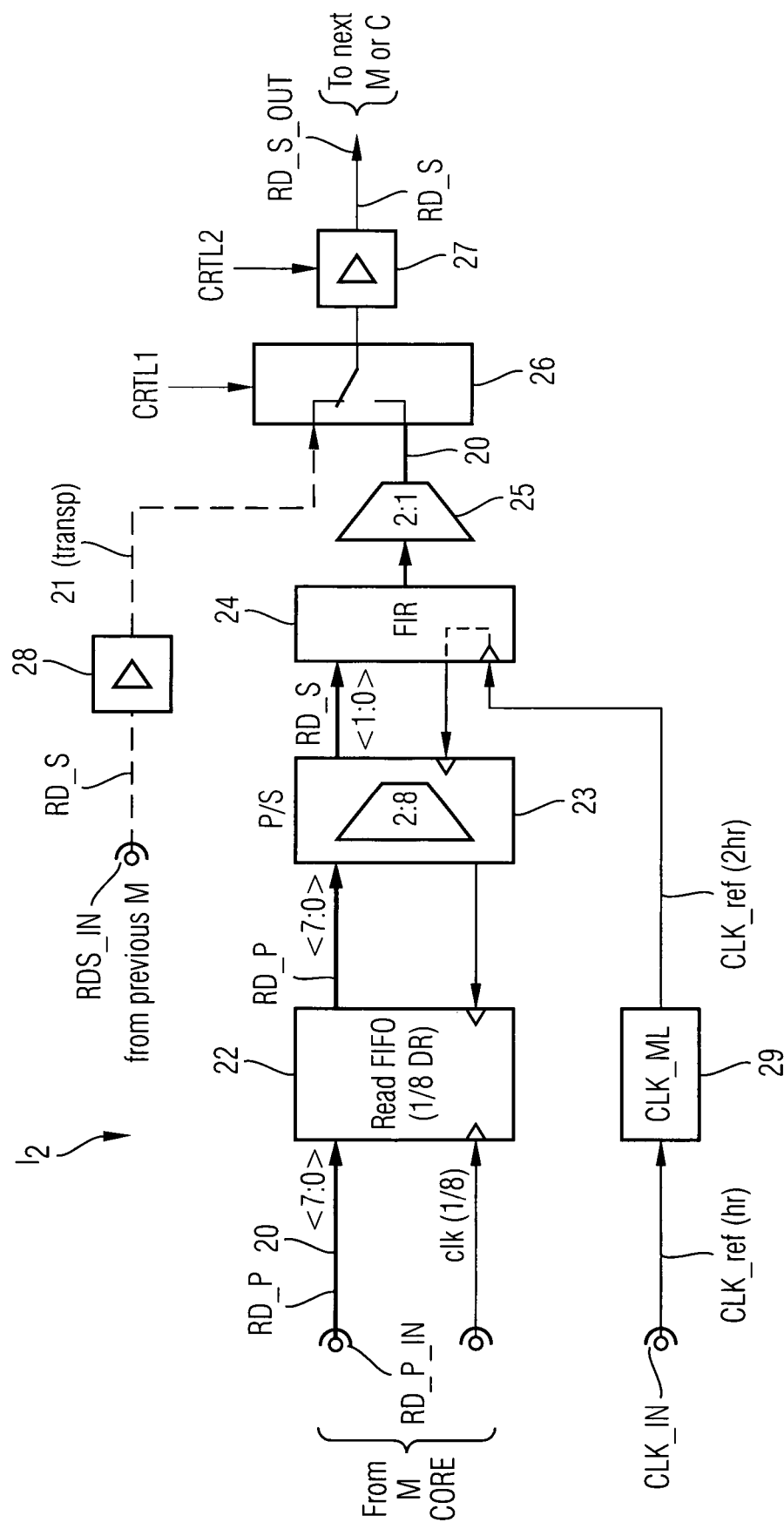
FIG. 4 schematically depicts a functional block diagram of a second interface circuit section to receive and transmit a read data signal stream and arranged to include a transparent read data re-driver/transmitter path according to the first embodiment of the inventive high-speed interface circuit of the present invention.

FIG. 4 schematically depicts the second interface circuit section I2 of the first embodiment of the high-speed interface circuit according to the invention. Differing from the first interface circuit section I1 of FIG. 3, the second interface circuit section I2 depicted in FIG. 4 includes a device for inserting local read data from the memory core of the present memory chip to the read data stream. That is, the second interface circuit section I2 selectively drives the read data signals to the next memory chip M or to the memory controller C or inserts even read data signals from the memory core of the present memory chip. The selection is controlled either by a separate control signal CTRL1 as shown in FIG. 4 supplied, for example, from the memory controller C or by a control bit included in the protocol of the write data-/command and address signal stream. The second interface circuit section I2 according to the first embodiment of the high-speed interface circuit as depicted in FIG. 4 includes a main read signal path 20 and a transparent read data re-driver/receiver path 21 (TRANSP) as depicted by broken lines in FIG. 4. The transparent read data re-driver/transmitter path 21 includes a transparent buffer device 28 connected to a serial read data input terminal RDS_IN. The serial read data input terminal RDS_IN can be connected for receiving a serial read data stream RD_S from a serial read data output terminal of a corresponding second interface circuit section of a preceding same memory chip M (not shown). The transparent read data re-driver/transmitter path of the second interface circuit section I2 does not include any clock signal synchronizing circuitry.

Parallel read data from the memory core MCORE of the present memory chip M is input through a parallel read data input terminal RD_P_IN to the main read signal path 20. The parallel read data RD_P received at the parallel read data input terminal RD_P_IN are at first fed to a read FIFO-unit 22 and has an internal clock rate of a clock signal CLK(⅛) received from the memory core MCORE. Read FIFO-unit 22 is configured for adapting the data rate of the parallel read data R_P to an internal clock domain of the second interface circuit section I2, the clock domain being determined by doubling the clock rate of a half rate reference clock signal CLK-ref(hr) received by a reference clock receiving terminal CLK_IN and via a clock signal multiplying unit (CLK_ML) 29.

The read FIFO-unit 22 feeds the parallel read data RD_P having the data rate adapted to the internal clock domain to a parallel-to-serial converter (P/S) 23 arranged in the main read signal path 20 after the read FIFO-unit 22 for carrying out a parallel-to-serial conversion of the parallel read data RP_P according to the doubled clock rate of the half rate reference clock CLK_ref(hr) and feeds a serial read data stream RD_S to a de-emphasis FIR-unit (FIR) 24 arranged to compensate the serial read data stream RD_S for intersymbol interference and through a 2:1 serializer 25 arranged in the main read signal path 20 after FIR 24 to a first input of a switching circuit 26 configured for inserting the parallel-to-serial converted read data read from the memory core MCORE and supplied through the main read signal path 20 into the serial read data stream RD_S supplied through the transparent read data re-driver/transmitter path 21. As mentioned above, the switching device 26 can be switched over either by an external control signal CRL1 as depicted in FIG. 4 or by a control signal (not shown) included in the protocol of the write data-/command and address signal stream received from and supplied through the first interface circuit section I1. From the output of the switching circuit 26 either the serial read data RD_S fed through the transparent read data re-driver/transmitter 21 or the serial read data stream RD_S fed through the main read signal path 20 are supplied through an output driver circuit 27 controllable by a second control signal CRTL2 to a serial read data output terminal RD_S_OUT and from there either to the next memory chip M (not shown) or to the memory controller C (not shown).

FIR 24 is connected in the main read signal path 20 as an option for carrying out a pre-emphasis to compensate for intersymbol interference and that the FIR 24 is not necessary when there is no possibility of intersymbol interference.

As described above, the first embodiment of the present high-speed interface circuit includes in the first interface circuit section I1 only a transparent write data-/command and address signal re-driver/transmitter path and in the second interface circuit section I2 only a transparent read data re-driver/transmitter path.

In a second embodiment depicted in FIGS. 5 to 9, the first interface circuit section I1 includes both a transparent write signal re-driver/transmitter path and a synchronized write signal re-driving/transmitting and synchronizing path, and the second interface circuit section I2 includes both a transparent read signal re-driver/transmitter path and a synchronized read signal re-driver/transmitting and synchronizing path.

Regarding the transparent write data-/command and address signal re-driver/transmitter path 11, the first interface circuit section I1 depicted in FIGS. 5 to 8 have the same circuit construction as the above-described transparent write data-/command and address signal re-driver/transmitter path 11 of the first interface circuit section I of the first embodiment of the present high-speed interface circuit as shown in FIG. 3. However the transparent write data-/command and address signal re-driver/transmitter path 11 of the first interface circuit section I1 shown in FIGS. 5 to 8 is not directly connected to the serial output terminal WR_S_OUT but connected to a first input of a first switching circuit 116.

Figure 5:
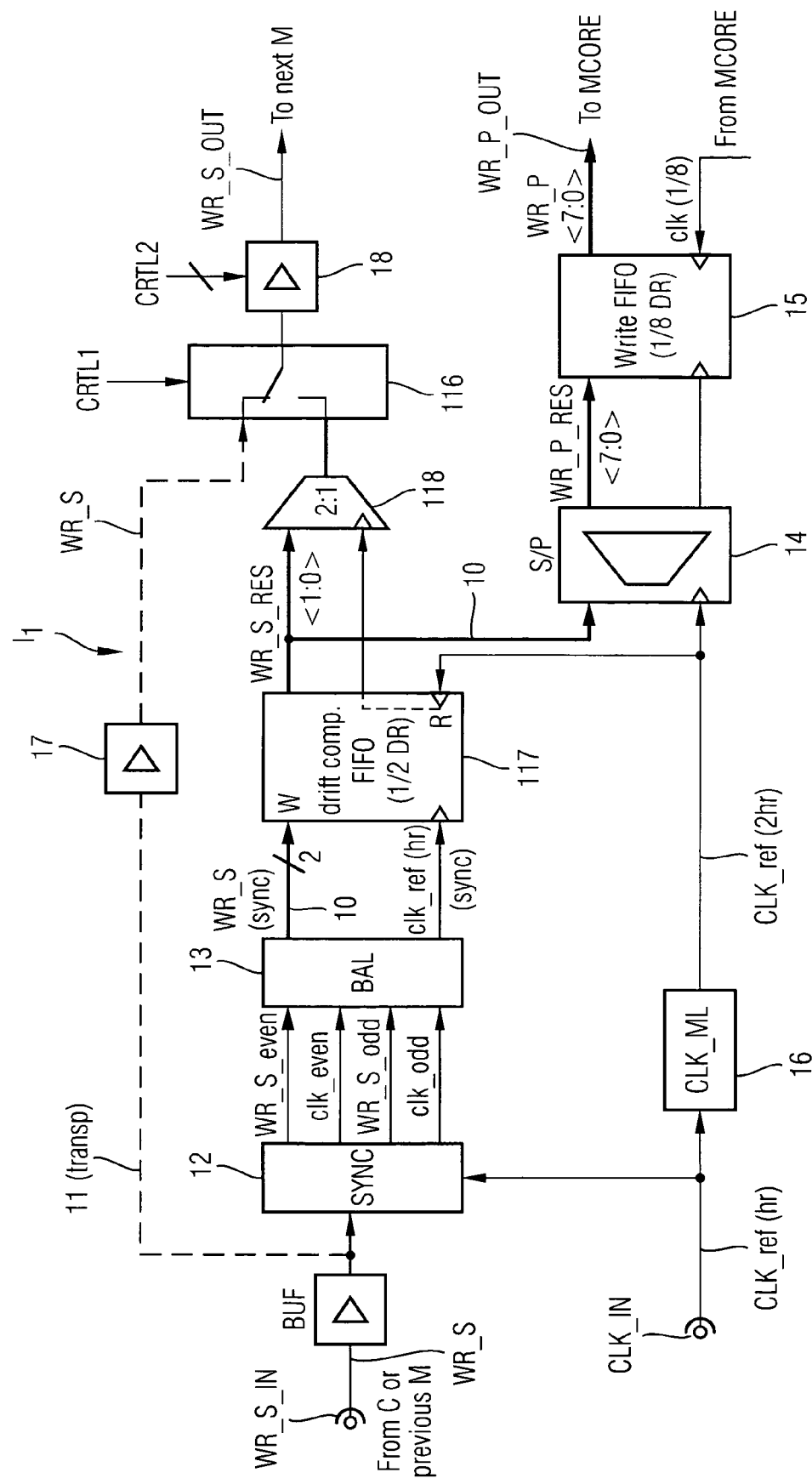
FIG. 5 schematically depicts a functional block diagram of a first embodiment of first interface circuit section to receive and transmit a write data-/command and address signal stream and arranged to include both a transparent write signal re-driving/transmitting path, not including a clock signal synchronizing circuitry as well as a synchronized write signal re-driving/transmitting and synchronization device in accordance with a second embodiment of a high-speed interface circuit of the present invention.

The main write signal path 10 of a first example of the first interface circuit section I1 shown in FIG. 5, in comparison with the main write signal path 10 in the first interface circuit I1 of FIG. 3, includes in addition to the units BUF, SYNC 12, BAL 13, S/P 14 and write FIFO 15 a drift compensation FIFO unit 117 as well as a 2:1 serializer 118, where each of the units BUF, SYNC 12, BAL 13, S/P 14, write FIFO 15, drift compensation FIFO-unit 117 and 2:1 serializer 118 are connected between the serial input terminal WRS_IN receiving a serial stream of write data-/command and address signal from a serial output terminal of a corresponding first interface circuit section of a preceding same memory chip (not shown) or from the serial output terminal of the memory controller (also not shown) and a parallel output terminal WR_P_OUT which supplies the parallel write data-/command and address signals to the memory core MCORE (not shown).

The switching circuit 116 is configured for switching over between the transparent write data-/command and address signal re-driver/transmitter path 11 and the synchronized write signal re-driving/transmitting and synchronization device including sync 12, BAL 13, drift compensation FIFO 117 and 2:1 serializer 118. The switching circuit 116 is controlled by a first control signal CRTL1 which may be either an external signal from the memory controller or included in the protocol of the write data-/command and address signal. Connected to the output side of the switching circuit 116 is a controllable transmitter driver 18 controlled by a second control signal CTRL2 for driving the serial write data-/command and address signals via the serial output terminal WR_S_OUT to a serial input terminal of a corresponding first interface circuit of a next same memory chip M (not shown).

Notably, S/P 14 converts the serial write data-/command and address signal stream synchronized by BAL 13 and drift compensated by drift compensation FIFO 117 and converts the write data-/command and address signals at the output of the drift compensation FIFO 117 into the re-synchronized parallel write data-/command and address signals with an arbitrary data width. Write FIFO 15 has the function, as in the embodiment of the first interface circuit section I1 depicted in FIG. 3, to convert the parallel write data-/command and address signals to the internal clock rate of the clock CLK(⅛) of the memory core MCORE (not shown). Write FIFO 15 compensates for different data skews and drifts. The internal clock domain of the first interface circuit section, as depicted in FIG. 5, is related to a double half rate reference clock signal CLK_ref(2 hr) generated by a clock signal multiplier (CLK_ML) 16 leased on the half rate clock signal CLK_ref(hr) received at the clock signal input terminal CLK_IN. SYNC 12 is arranged to supply the half rate reference clock signal CLK_ref(hr) to BAL 13, and BAL 13 is arranged to supply the half rate reference clock signal CLK_ref(hr) synchronized by SYNC 12 with the serial write data-/command and address signal stream to the drift compensation FIFO 117. Further the drift compensation FIFO 117 is arranged to supply the double half rate reference clock signal CLK_ref(2 hr) to the 2:1 serializer 118, and S/P 14 is arranged to supply the double rate reference clock signal CLK_ref(2 hr) to the write FIFO 15, respectively together with each the supplied write data-/command and address signals.

Figure 6:
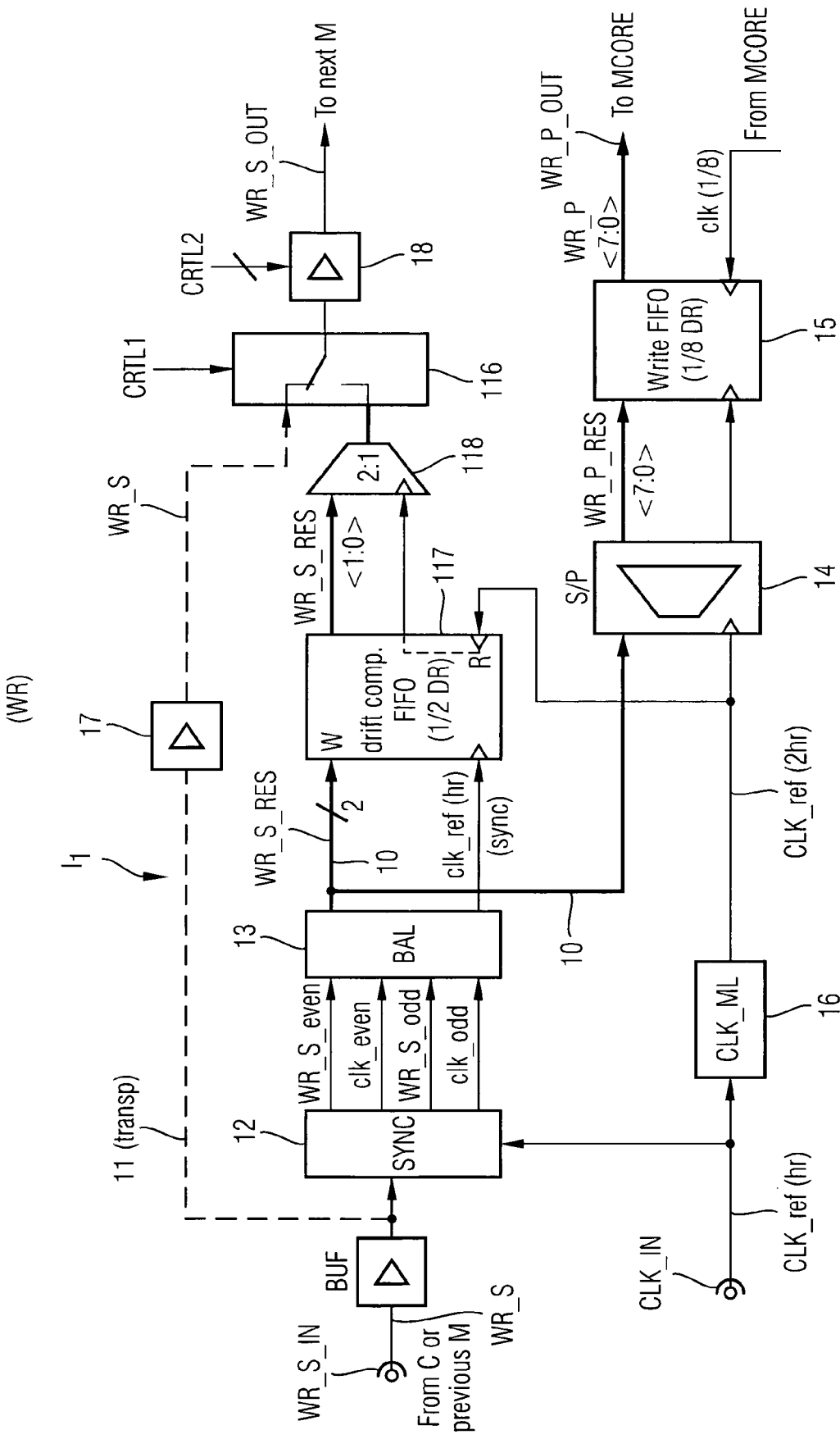
FIG. 6 schematically depicts a functional block diagram of a second embodiment of a first interface circuit section to receive and transmit a write data-/command and address signal stream and arranged so as to include both a transparent write signal re-driving/transmitting path not including a clock signal synchronizing circuitry as well as a synchronized write signal re-driving/transmitting and synchronization device in accordance with the second embodiment of the high-speed interface circuit of the present invention.

An alternative second example of the first interface circuit section I1 is depicted in FIG. 6 and differs from the previously described first example shown in FIG. 5 in that S/P 14 is not connected after the drift compensation FIFO 117 but is connected following BAL 13 so that the re-synchronized parallel write data-/command and address signals WR_P_RES data-aligned by BAL 13 are supplied to the memory core MCORE (not shown) by the write FIFO 15. The second example shown in FIG. 6 is advantageous as having a shorter system latency of the write data-/command and address signals.

Figure 7:
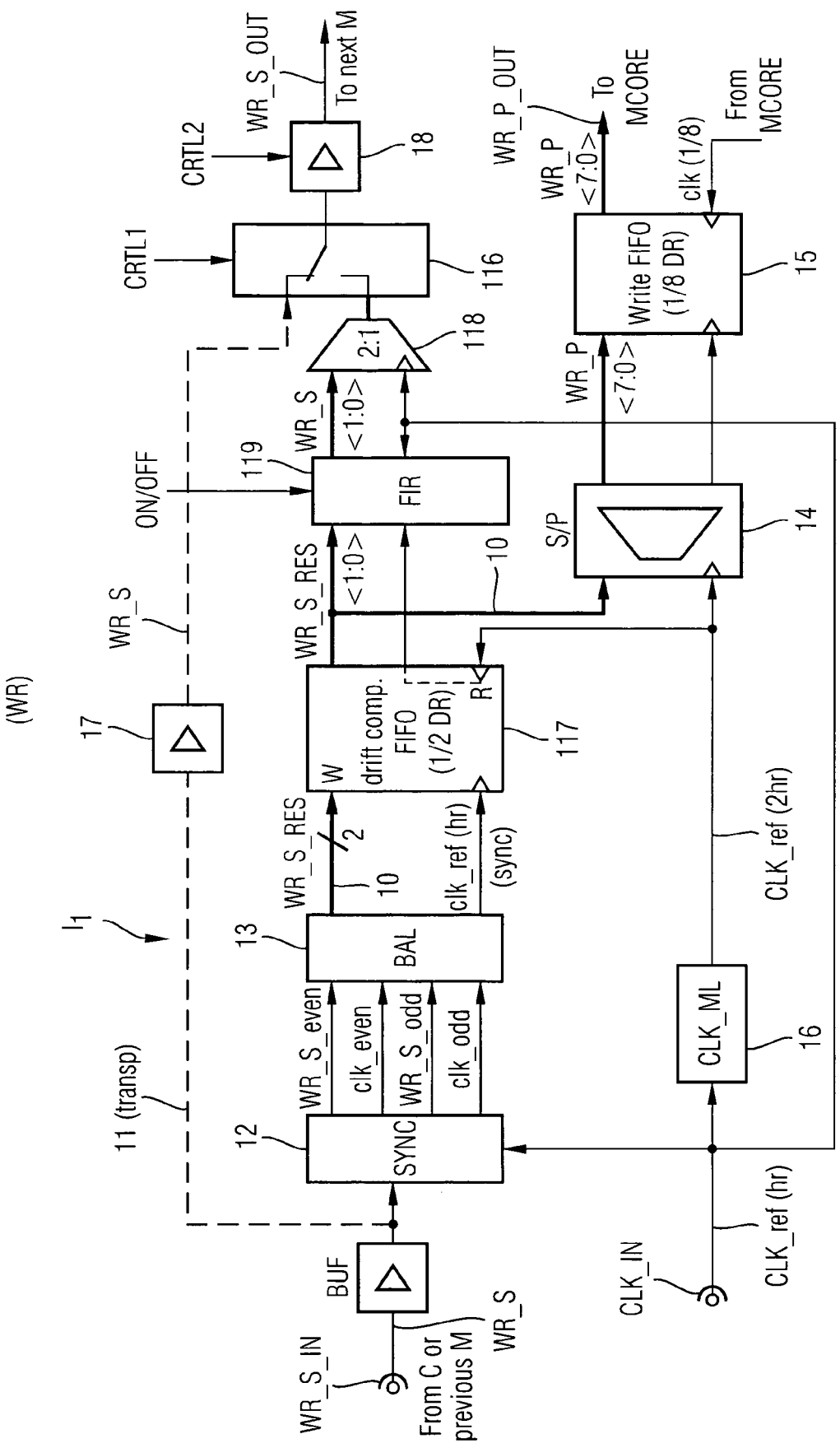
FIG. 7 schematically depicts a functional block diagram of a third embodiment of a first interface circuit section to receive and transmit a write data-/command and address signal stream and arranged so as to include both a transparent write signal re-driving/transmitting path not including a clock signal synchronizing circuitry as well as a synchronized write signal re-driving/transmitting and synchronization device in accordance with the second embodiment of the high-speed interface circuit of the present invention.

FIG. 7 depicts a third alternative example of the first interface circuit section I1 which differs from the first example described above with reference to FIG. 5 in that it further includes a finite impulse response unit (FIR) 119 inserted into the main write signal path 10 between the drift compensation FIFO 117 and the 2:1 serializer 1118. The FIR 119 is used for channel adaptation to compensate for intersymbol interference. It is noted that FIR 119 is only necessary in cases where intersymbol interference may occur. Therefore, FIR 119, if implemented in the first interface circuit section I1, may be switchable on/off by a corresponding ON/OFF switching signal.

Figure 8:
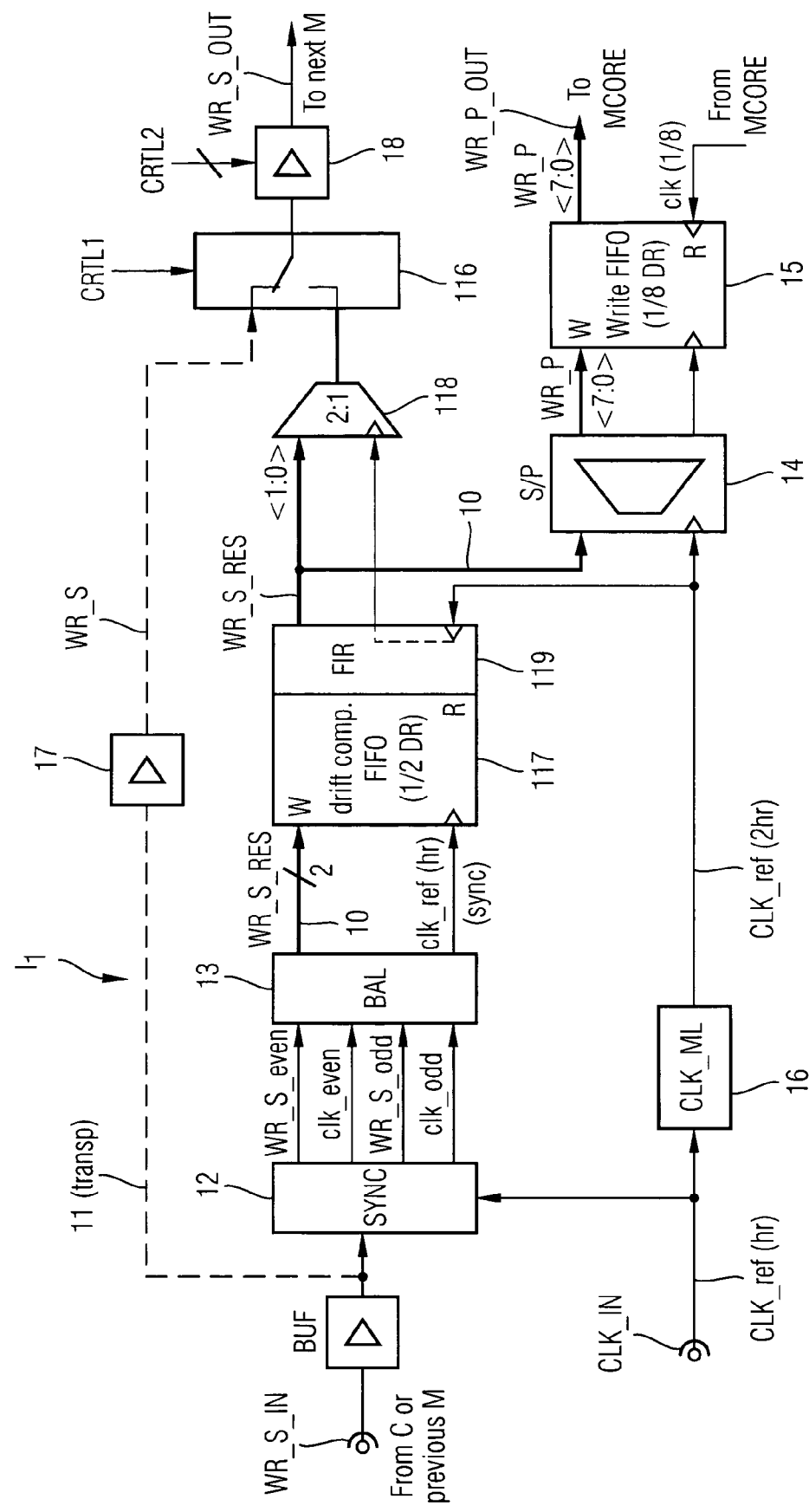
FIG. 8 schematically depicts a functional block diagram of a fourth embodiment of a first interface circuit section to receive and transmit a write data-/command and address signal stream and arranged to include both a transparent write signal re-driving/transmitting path not including a clock signal synchronizing circuitry as well as a synchronized write signal re-driving/transmitting and synchronization device in accordance with the second embodiment of the high-speed interface circuit of the present invention.

FIG. 8 shows a fourth example of the first interface circuit section I1 of the high-speed interface circuit according to the invention. The fourth example of the first interface circuit I1 represents an advantageous development of the third example of the first interface circuit section described above and depicted in FIG. 7. Namely, signal latency within the synchronized write data-/command and address signal re-driver/transmitter path 10 can be reduced by combining FIR 119 and drift compensation FIFO 117. This alternative example is advantageous when FIR 119 is based on an invert and delay principle for the re-synchronized serial write data-/command and address signal WR_S_ref because FIR 119, in the latter case, can be realized by a flip-flop. The signal rating is carried out in output stages (not shown) of FIR 119 either by parallel stages (not shown) or by switchable current sources (not shown).

Figure 9:
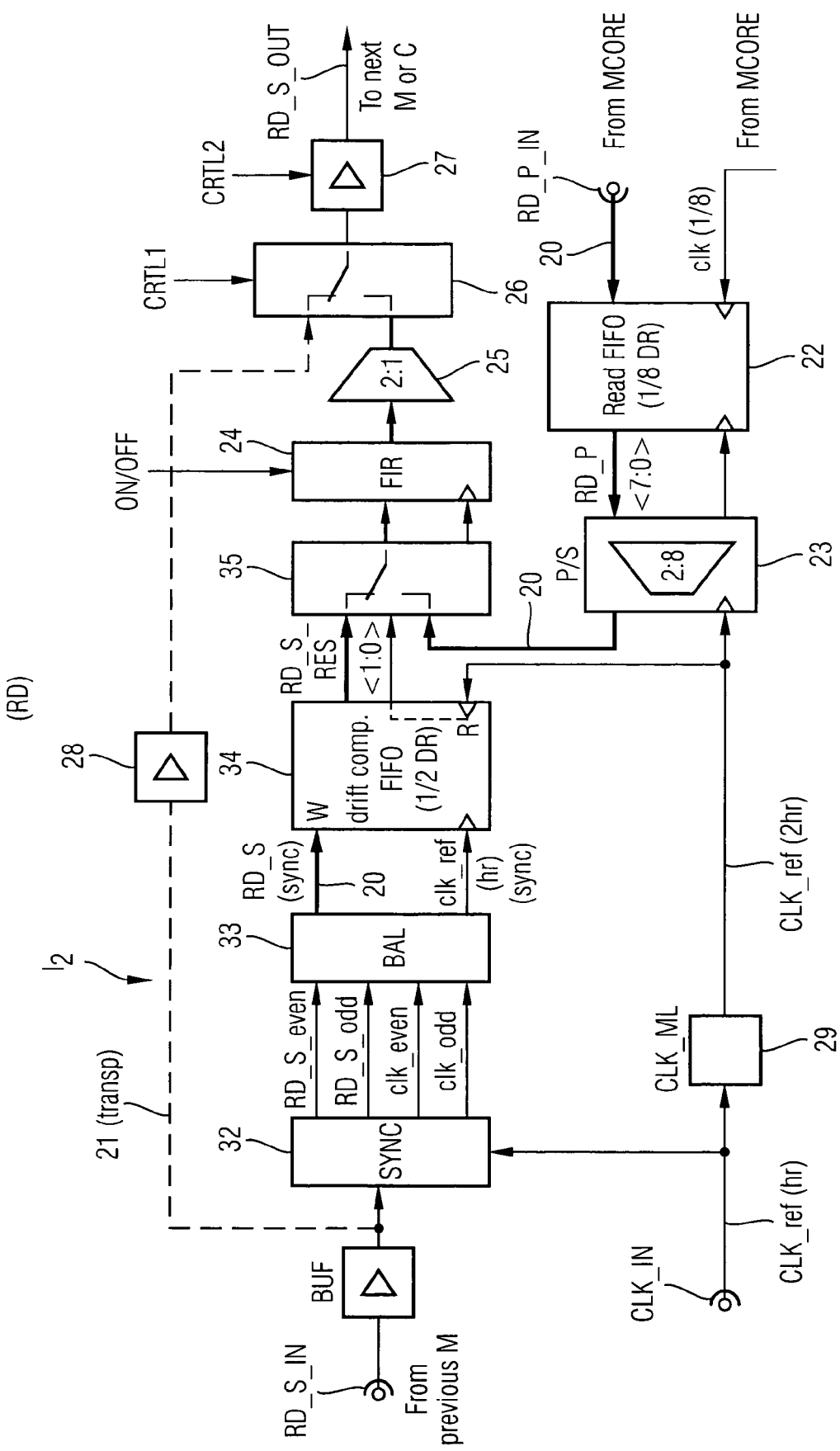
FIG. 9 schematically depicts a functional block diagram of a second interface circuit section to receive and transmit a read data signal stream and arranged to include both a transparent read signal re-driving/transmitting path not including a clock signal synchronizing circuitry as well as a synchronized read signal re-driver/transmitting and synchronization device according to the second embodiment of the inventive high-speed interface circuit of the present invention.

The second interface circuit section I2 of the second embodiment of the high-speed interface circuit, as depicted in FIG. 9, includes both a transparent read data re-driver/transmitter path 21 without including any clock signal synchronizing circuitry and only a transparent buffer circuit 28 and a synchronized read signal re-driver/transmitting and synchronization path partly realized by the main read signal path 20 and used for synchronizing re-driven serial read signals RD_S with the half rate reference clock signal CLK_ref(hr). First switching device 26 is arranged, in a like manner in the second interface circuit section I2 as depicted in the first embodiment of the present high-speed interface circuit of FIG. 4, before the serial output terminal RD_S_OUT and controlled either by the external control signal CTRL1 from the memory controller (not shown) C or by a control signal included in the protocol of the write data-/command and address signal stream. The first switching device 26 includes the function of selectively switching between the serial read data transmitted through the transparent read data re-driver/transmitter path 21 and the synchronized re-driven read signals transmitted through the main read signal path and synchronized by the re-driver/transmitting and synchronization device. The synchronized read data re-driver/transmitter and synchronization device include as a part of the main read signal path 20 a bit synchronization unit (SYNC) 32 connected after the serial read data input terminal RD_S_IN and configured for sampling and bit synchronizing the serial stream of read data RD_S in accordance with the half rate reference clock signal CLK_ref(hr), an even-odd bit alignment unit (BAL) 33 serially connected after SYNC 32 and configured for buffering a even-odd read data signal synchronized and sampled by SYNC 32 and aligning the same synchronously to the reference clock signal which is supplied from SYNC 32 together with the serial read data stream RD_S, a drift compensation FIFO 34 serially connected in sequence to BAL 33 and configured for compensating phase shift of the even-odd bit aligned read data signals in synchronism with the half rate reference clock signal CLK_ref(hr) (sync) as supplied and synchronized by BAL 33, second switching device 35 inserted between P/S 23 and the de-emphasizes FIR-unit 24 of the main read signal path 20 and configured for switching over between the synchronized re-driven read data signals and the parallel-to-serial converted read data signals from the even memory core (not shown) in synchronism with a double half rate reference clock signal CLK-ref(2 hr) generated by a clock multiplying circuit 29. The second switching device 35 inserts the parallel-to-serial converted read data signal from the even memory core MCORE into the serial read data signal stream.

Read FIFO 22, P/S 23, FIR 24, 2:1 serializer 25, first switching circuit 26, transmitter driver 27 and a buffer/driver 28 of the second interface circuit section I2 of FIG. 9 may be respectively identical and can respectively have identical functions as the corresponding units of the second interface circuit section I2 of the first embodiment of the present high-speed interface circuit as depicted in FIG. 4. Likewise the buffer circuit BUF, clock signal multiplying circuit 29, SYNC 32, BAL 33 and drift compensation FIFO 34 can respectively be identical and have equal functions as the corresponding units BUF, SYNC 12, BAL 13, drift compensation FIFO 117 and clock multiplying circuit CLK_ML 16 included in the first interface circuit section I1 of the second embodiment of the present high-speed interface circuit as depicted in FIG. 6, with the exception that BUF, clock multiplying circuit 29, SYNC 32, BAL 33 and drift compensation FIFO 34 depicted in FIG. 9 are processing the serial read data stream in the synchronized read data re-driver/transmitter path 20, while the units BUF, SYNC 12, BAL 13, clock multiplying circuit 16 and drift compensation FIFO 117 in FIG. 6 are processing the serial write data stream WR_S. Further, like the FIR 119 in the first interface circuit section I1 according to FIG. 7, the FIR 24 in the second interface circuit section I2 of FIG. 9 is only necessary for channel adaptation if intersymbol interference is possible and can therefore be omitted or switched off by an on/off signal ON/OFF when intersymbol interference cannot occur.

The reference clock signal of the first and second interface circuit sections I1 and I2 of the first and second embodiments of the present high-speed interface circuit received at the reference clock receiving terminal CLK_IN is a half rate reference clock signal CLK_ref(hr), the clock rate of which is one half of the clock rate of a memory system clock (not shown). However, the clock rate of the reference clock signal may also be one third or one quarter of the clock rate of a memory system clock (not shown). Likewise, the clock rate of the reference clock signal can be equal to the clock rate of the memory system clock (not shown).

Preferably, the present high-speed interface circuits depicted in FIGS. 3 to 9 and described above are integrated in a semiconductor memory chip which includes a memory core and the present high-speed interface circuit having one or more of the features discussed above. The memory core of this semiconductor memory chip may be a dynamic RAM memory core.

Figure 1A:
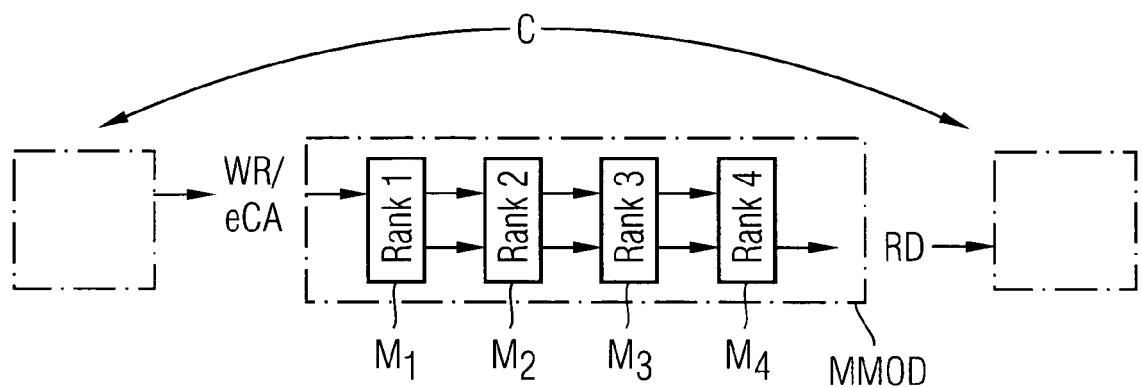
FIGS. 1A to 1D depict principle arrangements of memory chips in a memory system in a loop forward architecture, a shared loop topology, a loop back architecture and a star topology, respectively.
Figure 1B:
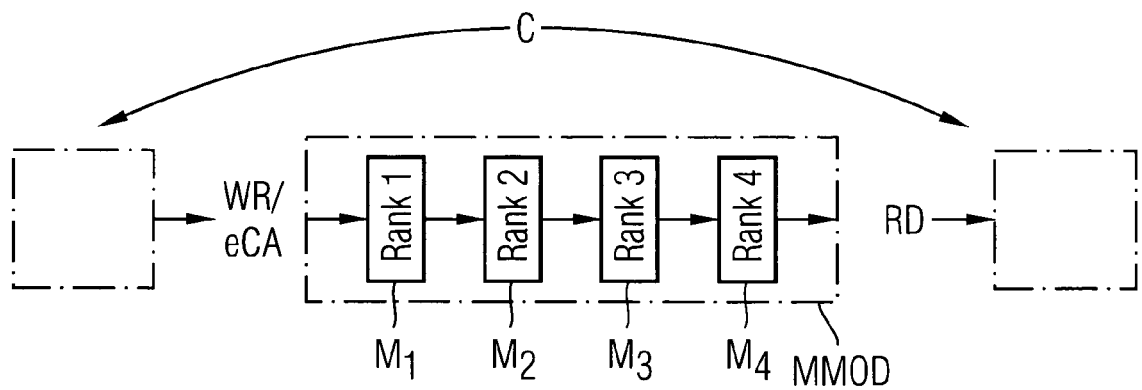
Figure 1C:
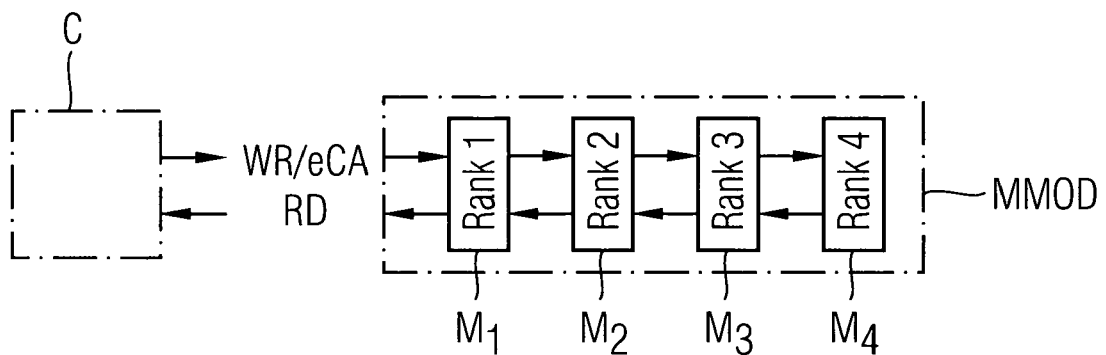
Figure 1D:
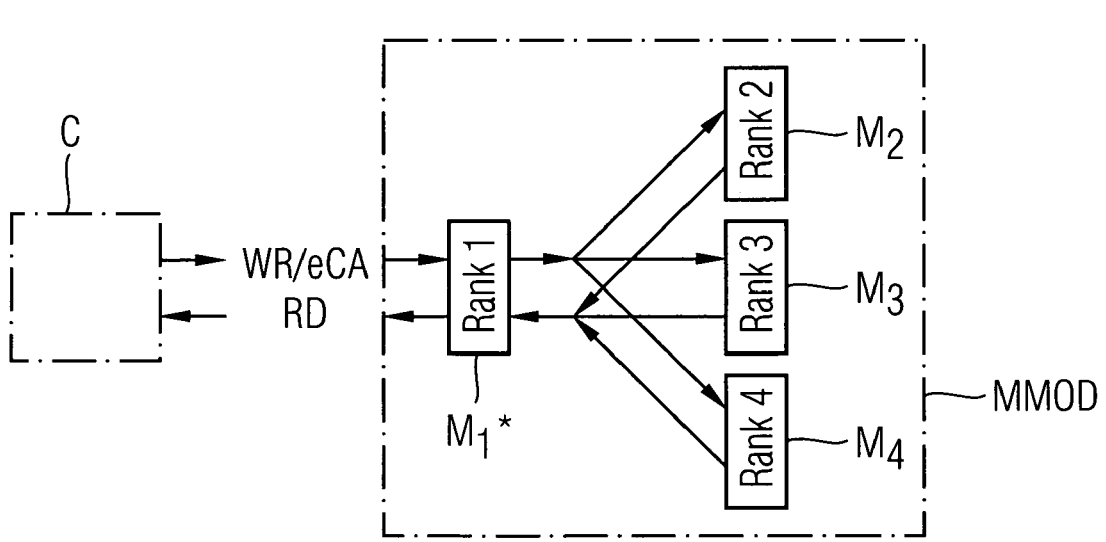
Figure 2:
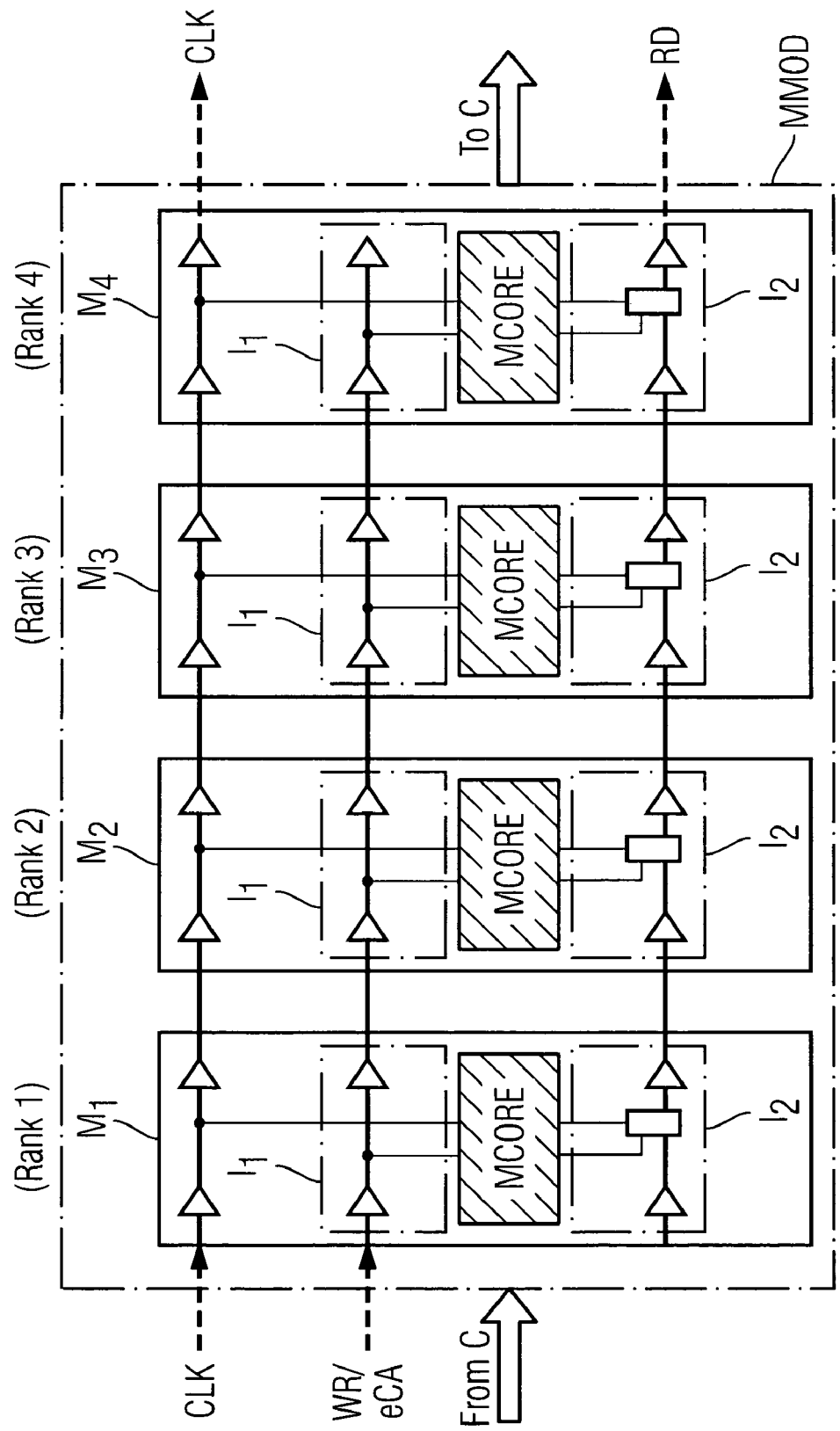
FIG. 2 depicts a loop forward architecture of four memory chips forming a cascade on a memory module as well as first and second interface circuit sections forming high-speed interface circuits each for receiving and transmitting a write data-/command and address signal stream and a read data signal stream as well as a clock signal path from and to a memory controller.

Further, a plurality of semiconductor memory chips each having such a high-speed interface circuit according to the invention can be included in a semiconductor memory system, where the memory chips are arranged on a memory module in the form of a cascade of different memory ranks and connected by a write data-/command and address bus and a read data bus in a point-to-point fashion to a memory controller such as is depicted in FIG. 2. In this arrangement of a semiconductor memory system the semiconductor memory chips, the write data-/command and address bus and the read data bus may be arranged on the memory module and connected to the memory controller in a loop forward architecture, in a loop back architecture or in a ring architecture.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference signs | |
|---|---|
| M, M1, M2, M3, M4 | semiconductor memory chips |
| MMOD | memory module |
| C | memory controller |
| WR/eCA | write data-/command and address bus |
| RD | read data bus |
| M1 * | master memory chip |
| CLK | clock |
| I1 | first interface circuit section |
| I2 | second interface circuit section |
| MCORE | memory core |
| WRS_IN | serial write signal input terminal |
| WR_S | serial write data-/command and address signal |
| CLK_IN | reference clock input terminal |
| CLK_ref(hr) | half rate reference clock signal |
| BUF | buffer circuit |
| 10 | main write signal path |
| 11 | transparent write data-/command and address signal redriver/transmitter path |
| SYNC 12 | bit synchronization unit |
| BAL 13 | even-odd bit alignment unit |
| S/P 14 | serial-to-parallel converter unit |
| 15 | data delivery FIFO-unit (write FIFO) |
| 16 | clock buffer/divider |
| 17 | write signal re-driver buffer |
| 18 | serial write data transmitting/driving circuit |
| WR_S_even | even serial write data stream |
| WR_S_odd | odd serial write data stream |
| CLK_ref(hr) (SYNC) | synchronized half rate reference clock signal |
| CLK_ref(1/8) | octal rate reference clock signal |
| WR_P | parallel write data-/command and address signal |
| WR_P_OUT | parallel write output terminal |
| WR_S_OUT | serial write data output terminal |
| RD_P | parallel read data |
| RD_P_IN | parallel read data input terminal |
| 22 | read FIFO unit |
| P/S 23 | parallel-to-serial converter unit |
| RD_S | serial read data |
| RD_S_IN | serial read data input terminal |
| 20 | main read signal path |
| 21 | transparent read data re-driver/transmitter path |
| FIR 24 | de-emphasize FIR-unit |
| 25 | 2:1 serializer |
| 26 | first switching circuit |
| 27 | serial read data transmitter driver |
| RD_S | serial read data |
| RD_S_OUT | serial read data output terminal |
| CTRL1 | first control signal |
| CTRL2 | second control signal |
| 28 | transparent read data re-driver/transmitting circuit |
| 29 CLK_ML | clock signal multiplying circuit |
| CLK_ref(2hr) | double half rate reference clock signal |
| SYNC 32 | bit synchronization unit |
| BAL 33 | even-odd bit alignment unit |
| 34 | drift compensation FIFO-unit |
| 35 | second switching circuit |
| 117 | drift compensation FIFO-unit |
| 118 | 2:1 serializer |

-continued

| List of reference signs | |
|---|---|
| 116 | first switching circuit |
| WR_S_RES | re-synchronized serial write data-/command and address signal stream |
| WR_P_RES | re-synchronized parallel write data-/command and address signal stream |
| 119 | de-emphasizes FIR-unit |
| ON/OFF | on/off switching signal |

What is claimed is:

1. A high-speed interface circuit implemented in a semiconductor memory chip including a memory core, the high-speed interface circuit comprising:

a first interface circuit section connectable to a write data-/command and address bus and including:

a serial input terminal to receive a serial stream of write data-/command and address signals from a serial output terminal of a corresponding first interface circuit section of a preceding same memory chip or from a serial output terminal of a memory controller, the serial input terminal further being connected to:

a write data-/command and address re-driver/-transmitter path arranged to re-drive the serial stream of write data-/command and address signals to a serial output terminal of the write data-/command and address re-driver/-transmitter path and connectable to a serial input terminal of a corresponding first interface circuit of a next same memory chip; and a main write signal path arranged between the serial input terminal and a parallel output terminal and including serial-to-parallel conversion and synchronization means for serial-to-parallel converting and synchronizing with a reference clock signal the write data-/command and address signals received at the serial input terminal and delivering the serial-to-parallel converted and synchronized write data-/command and address signals to the parallel output terminal of the first interface circuit section and from the parallel output terminal of the first interface circuit to the memory core; and a second interface circuit section connectable to a read data bus and including:

a parallel read data input terminal connected to the memory core to receive parallel read data from the memory core;

a serial read data input terminal connected to receive a serial read data stream from a serial read data output terminal of a corresponding second interface circuit section of a preceding same memory chip and arranged to re-drive the received serial read data stream through a read data re-driver/receiver path to a serial read data output terminal of the second interface circuit section; and a main read signal path connected between the parallel read data input terminal and the serial read data output terminal of the second interface circuit section and having means for inserting the parallel-to-serial converted read data read from the memory core and received at a parallel input terminal of the main read signal path into the serial read data stream from the serial read data input terminal, synchronizing the serial read data stream with a reference clock signal and providing the serialized read data stream to the serial read data output terminal connectable with the read data bus to a serial read data input terminal of a corresponding second interface circuit section of a next same memory chip or to a serial read data input terminal of the memory controller;

wherein the first and second interface circuit sections further include a reference clock receiving terminal to receive the reference clock signal.

2. The high-speed memory interface circuit of claim 1, wherein the write data-/command and address signal re-driver/transmitter path of the first interface circuit section includes a transparent write signal re-driving/transmitting section without a clock signal synchronizing circuitry.

3. The high-speed memory interface circuit of claim 1, wherein the read data re-driver/transmitter path of the second interface circuit section includes a transparent read signal re-driving transmitting section without a clock signal synchronizing circuitry.

4. The high-speed interface circuit of claim 1, wherein the write data-/command and address signal re-driver/transmitter path of the first interface circuit section includes synchronized write signal re-driving/transmitting and synchronization means for synchronizing the re-driven write data-/command and address signals with the reference clock signal.

5. The high-speed interface circuit of claim 1, wherein the read data re-driver/transmitter path of the second interface circuit section includes synchronized read signal re-driver/transmitting and synchronization means for synchronizing the re-driven read signals with the reference clock signal.

6. The high-speed interface circuit of claim 2, wherein the write data-/command and address signal re-driver/transmitter path of the first interface circuit section further includes a first switching device arranged to receive the serial write data-/command and address stream before the serial output terminal of the first interface circuit section, the first switching device being controlled by an external control signal from the memory controller or by a control signal included in the protocol of the write data-/command and address signal stream to selectively switch between the transparent write signal re-driving/transmitting section and the synchronized write signal re-driver/transmitter means.

7. The high-speed interface circuit of claim 3, wherein the second interface circuit section further includes first switching device arranged before the serial output terminal of the second interface circuit section, the first switching device being controlled by a control signal included in the protocol of the write data-/command and address signal or by an external signal from the memory controller to selectively switch between the transparent read signal re-driving transmitting section and the synchronized read signal re-driver/transmitting and synchronization means.

8. The high-speed interface circuit of claim 1, wherein the first interface circuit section includes:
a bit synchronization unit arranged after the serial input terminal to sample and bit-synchronize the serial stream of write data-/command and address signals according to the reference clock signal;
an even-odd bit alignment unit serially connected after the bit synchronization unit and configured to buffer the serial write data-/command and address signals synchronized and sampled by the bit synchronization unit and align the sampled even and odd signals synchronously with the reference clock signal;
a serial-to-parallel converter unit serially connected after the even-odd bit alignment unit and configured to convert the serial write data-/command and address signals buffered and aligned by the even/odd bit alignment unit into a parallel data stream having an arbitrary data width; and
a data delivery FIFO-unit connected after the serial-to-parallel converter unit at the parallel output terminal and configured to deliver the parallel data stream to the memory core synchronized with an internal clock rate of the memory core and compensating for different data skews and drifts.

9. The high-speed interface circuit of claim 8, wherein the bit synchronization unit, the even-odd alignment unit, the serial-to-parallel converter unit and the data delivery FIFO-unit are consecutively arranged such that each unit supplies the reference clock signal synchronized by the bit synchronization unit with the serial write data-/command and address signal stream to the next consecutive unit together with each of the supplied write data-/command and address signals.

10. The high-speed interface circuit of claim 8, wherein the first interface circuit section further includes:
a drift compensation FIFO-unit serially connected after the even-odd bit alignment unit and configured to compensate phase drift of the even-odd bit aligned serial write data-/command and address signals in synchronism with the reference clock signal; and
a 2:1-serializer serially arranged after the drift compensation FIFO-unit.

11. The high-speed interface circuit of claim 10, wherein the bit synchronization unit and the even-odd bit alignment unit are each respectively arranged to supply the reference clock signal synchronized by the bit synchronization unit with the serial write data-/command and address signal stream to the next consecutive unit together with each of the supplied write data-/command and address signals.

12. The high-speed interface circuit of claim 10, wherein a data input of the serial-to-parallel converter unit is connected to an output of the drift compensation FIFO-unit.

13. The high-speed interface circuit of claim 10, wherein a data input of the serial-to-parallel converter unit is connected to an output of the even-odd bit alignment unit.

14. The high-speed interface circuit of claim 8, wherein the first interface circuit section further includes:
a drift compensation FIFO-unit serially connected after the even-odd bit alignment unit and configured for compensating phase drift of the even-odd bit aligned serial write data-/command and address signals in synchronism with the reference clock signal;
a de-emphasis FIR-unit serially connected after the drift compensation FIFO and configured for channel adaptation to compensate for intersymbol interference; and
a 2:1 serializer serially connected after the de-emphasis FIR-unit.

15. The high-speed interface circuit of claim 14, wherein the bit synchronization unit and the even-odd bit alignment unit are each respectively configured to supply the reference clock signal synchronized by the bit synchronization unit with the serial write data-/command and address signal stream to the next consecutive unit together with each of the supplied write data-/command and address signals.

16. The high-speed interface circuit of claim 14, wherein a data input of the serial-to-parallel converter unit is connected to an output of the drift compensation FIFO-unit.

17. The high-speed interface circuit of claim 14, wherein the de-emphasis FIR-unit and the drift compensation FIFO-unit are combined and a data input of the serial-to-parallel converter unit is connected to an output of the de-emphasis FIFO-unit.

18. The high-speed interface circuit of claim 8, wherein the drift compensation FIFO-unit has a depth according to plural symbol sequences of the serial write data-/command and address signals.

19. The high-speed interface circuit of claim 8, wherein the de-emphasis FIR-unit is switched on/off by an external signal from the memory controller.

20. The high-speed interface circuit of claim 1, wherein, in the main read signal path, the second interface circuit section includes:
a read FIFO-unit arranged at the parallel read data input terminal to adapt a data rate of data read from the memory core to a clock domain of the second interface circuit section;
a parallel-to-serial converter unit connected after the read FIFO-unit and configured to achieve parallel-to-serial conversion of the read data and to convert the clock rate of the read data to the clock rate of the reference clock;
a de-emphasis FIR-unit serially connected after the parallel-to-serial converter circuit and configured to compensate for intersymbol interference; and
a 2:1 serializer serially arranged after the de-emphasis FIR-unit.

21. The high-speed interface circuit of claim 20, wherein the de-emphasis FIR-unit is switched on/off by an external signal from the memory controller.

22. The high-speed interface circuit of claim 20, wherein the de-emphasis FIR-unit is configured to receive the reference clock signal and supply the reference clock signal to the parallel-to-serial converter unit, and parallel-to-serial converter unit is configured to supply the reference clock signal to the read FIFO-unit.

23. The high-speed interface circuit of claim 20, wherein the read data re-driver/transmitter path of the second interface circuit section includes:
a transparent read signal re-driving/transmitting device without any clock signal synchronizing circuitry;
synchronized read data re-driver/transmitting and synchronization means for synchronizing the re-driven read signals with the reference clock signal; and
a first switching device arranged immediately before the serial output terminal of the second interface circuit section, the first switching device being controlled by a control bit included in the protocol of the write data-/command and address signals or by an external signal from the memory controller to selectively switch between the transparent read signal re-driving/transmitting device and the synchronized read data re-driver/transmitter means;
wherein the synchronized read data re-driver/transmitter and synchronization means further includes:
a bit synchronization unit serially connected after the serial read data input terminal configured to sample and bit-synchronize the serial stream of read data with the reference clock signal;
an even-odd bit alignment unit serially connected after the bit synchronization unit and configured to buffer the serial read data signals synchronized and sampled by the bit synchronization unit and align the serial read data signals synchronously to the reference clock signal;
a drift compensation FIFO-unit serially connected after the even-odd bit alignment unit and configured to compensate phase drift of the even-odd bit aligned read data signals in synchronism with the reference clock signal;
a second switching device inserted between the drift compensation FIFO-unit, the parallel-to-serial converter unit and the de-emphasis FIR-unit of the main read signal path and configured to switch between the synchronized re-driven read data signals and the parallel-to-serial converted read data signals in synchronism with the reference clock signal and to insert the parallel-to-serial converted read data signals into the read data signal stream;
the de-emphasis FIR-unit;
the 2:1 serializer of the main read signal path; and
the first switching device.

24. The high-speed interface circuit of claim 23, wherein the bit synchronization unit and the even-odd bit alignment unit are each respectively configured to supply the reference clock signal synchronized by the bit synchronization unit with the serial read data stream from the serial read data input terminal to the next consecutive unit together with each of the supplied read data signals.

25. The high-speed interface circuit of claim 23, wherein the drift compensation FIFO-unit and the parallel-to-serial converter unit are configured to belong to the same clock domain.

26. The high-speed interface circuit of claim 1, wherein the clock rate of the reference clock signal is selected from the group consisting of: one half of the clock rate of a memory system clock, one third of the clock rate of a memory system clock, one quarter of the clock rate of a memory system clock, and equal to the clock rate of a memory system clock.

27. A semiconductor memory chip including a memory core and a high-speed interface circuit, the high-speed interface circuit comprising:
a first interface circuit section connectable to a write data-/command and address bus and including:
a serial input terminal to receive a serial stream of write data-command and address signals from a serial output terminal of a corresponding first interface circuit section of a preceding same memory chip or from a serial output terminal of a memory controller, the serial input terminal further being connected to:
a write data-/command and address re-driver/-transmitter path arranged to re-drive the serial stream of write data-/command and address signals to a serial output terminal of the write data-/command and address re-driver/-transmitter path and connectable to a serial input terminal of a corresponding first interface circuit of a next same memory chip; and
a main write signal path arranged between the serial input terminal and a parallel output terminal and including serial-to-parallel conversion and synchronization means for serial-to-parallel converting and synchronizing with a reference clock signal the write data-/command and address signals received at the serial input terminal and delivering the serial-to-parallel converted and synchronized write data-/command and address signals to the parallel output terminal of the first interface circuit section and from the parallel output terminal of the first interface circuit to the memory core; and a second interface circuit section connectable to a read data bus and including:
  a parallel read data input terminal connected to the memory core to receive parallel read data from the memory core;
  a serial read data input terminal connected to receive a serial read data stream from a serial read data output terminal of a corresponding second interface circuit section of a preceding same memory chip and arranged to re-drive the received serial read data stream through a read data re-driver/receiver path to a serial read data output terminal of the second interface circuit section; and
  a main read signal path connected between the parallel read data input terminal and the serial read data output terminal of the second interface circuit section and having means for inserting the parallel-to-serial converted read data read from the memory core and received at a parallel input terminal of the main read signal path into the serial read data stream from the serial read data input terminal, synchronizing the serial read data stream with a reference clock signal and providing the serialized read data stream to the serial read data output terminal connectable with the read data bus to a serial read data input terminal of a corresponding second interface circuit section of a next same memory chip or to a serial read data input terminal of the memory controller;
  wherein the first and second interface circuit sections further include a reference clock receiving terminal to receive the reference clock signal.

28. The semiconductor memory chip of claim 27, wherein the memory core comprises a dynamic RAM-memory core.

29. A semiconductor memory system including a plurality of semiconductor memory chips as recited in claim 27, wherein the semiconductor memory chips are arranged on a memory module in a cascade of different memory ranks and connected by a write data-/command and address bus and a read data bus and in a point-to-point fashion to a memory controller.

30. The memory system of claim 29, wherein the semiconductor memory chips and the write data-/command and address bus and the read data bus are arranged on the memory module and connected to the memory controller in a loop forward architecture.

31. The memory system of claim 29, wherein the semiconductor memory chips and the write data-/command and address bus and the read data bus are arranged on the memory module and connected to the memory controller in a loop back architecture.

32. The memory system of claim 29, wherein the semiconductor memory chips and the write data-/command and address bus and the read data bus are arranged on the memory module and connected to the memory controller in a ring architecture.

* * * * *

UNITED STATES PATENT AND TRADEMARK OFFICE
CERTIFICATE OF CORRECTION

PATENT NO. : 7,184,360 B2  Page 1 of 1
APPLICATION NO. : 11/152769
DATED : February 27, 2007
INVENTOR(S) : Peter Gregorius et al.

It is certified that error appears in the above-identified patent and that said Letters Patent is hereby corrected as shown below:

Col. 9, line 34:    Replace "comrnand" with -- command --

Col. 13, line 10:   Replace "1118" with -- 118 --

Signed and Sealed this

Twenty-seventh Day of November, 2007

JON W. DUDAS
*Director of the United States Patent and Trademark Office*